(12) United States Patent
Canudas De Wit et al.

(10) Patent No.: US 9,264,041 B2
(45) Date of Patent: Feb. 16, 2016

(54) DIGITAL CONTROL DEVICE FOR A PARALLEL PMOS TRANSISTOR BOARD

(75) Inventors: Carlos Canudas De Wit, Saint Ismier (FR); Carolina Albea Sanchez, Seville (ES)

(73) Assignees: CENTRE NATIONAL DE LA RECHERCHE SCIENTIFIQUE (C.N.R.S), Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 745 days.

(21) Appl. No.: 13/141,466

(22) PCT Filed: Dec. 17, 2009

(86) PCT No.: PCT/FR2009/001442
§ 371 (c)(1),
(2), (4) Date: Aug. 8, 2011

(87) PCT Pub. No.: WO2010/072913
PCT Pub. Date: Jul. 1, 2010

(65) Prior Publication Data
US 2011/0295441 A1    Dec. 1, 2011

(30) Foreign Application Priority Data
Dec. 22, 2008 (FR) ..................................... 08 07342

(51) Int. Cl.
*G05D 9/12* (2006.01)
*H03K 19/00* (2006.01)
*H03K 17/12* (2006.01)

(52) U.S. Cl.
CPC .......... *H03K 19/0016* (2013.01); *H03K 17/122* (2013.01)

(58) Field of Classification Search
CPC ..................................................... H03K 17/122
USPC ....................... 700/298, 33, 34; 323/274, 281
See application file for complete search history.

(56) References Cited

U.S. PATENT DOCUMENTS 5,614,801 A * 3/1997 Miramonti .................... 318/609
5,969,514 A   10/1999 Merrill
7,122,990 B2 * 10/2006 Lin ............................... 318/638

FOREIGN PATENT DOCUMENTS

DE  26 15 752 A1  10/1977
EP  0 544 362 A2   6/1993

OTHER PUBLICATIONS

Ng et al., "Integrated Switched Mode Power Supplies Using Digital Controllers" 8th International Conference on Solid-State and Integrated Circuit Technology. 2006, pp. 1614-1617.*

(Continued)

*Primary Examiner* — Mohammad Ali
*Assistant Examiner* — Emilio J Saavedra
(74) *Attorney, Agent, or Firm* — Young & Thompson

(57) ABSTRACT

A digital control device for a parallel PMOS transistor board, includes: an operative memory for digitally storing error data between a target voltage and a setpoint voltage as well as control data, each datum being provided with a time marker, a digital selected order filter (36) for computing setpoint incrementation data from error data in the operative memory selected based on input error data, and for storing the input error data with a corresponding time marker in the operative memory, and a control computer (38) for computing new control data from the control incrementation data and control data in the operative memory selected based on input error data and for storing the new control data in the operative memory.

8 Claims, 2 Drawing Sheets

(56) References Cited

OTHER PUBLICATIONS

Peretz et al., "Time domain design of digital compensators for PWM DC-DC converters" IEEE Twenty Second Annual IEEE Applied Power Electronics Conference, Feb. 25-Mar. 1, 2007. pp. 887-893.*

Albea et al., "Advanced control design for voltage scaling converters" 34th Annual Conference of IEEE Industrial Electronics, Nov. 10-13, 2008 pp. 79-84.*

International Search Report, dated Feb. 12, 2010, from corresponding PCT application.

* cited by examiner

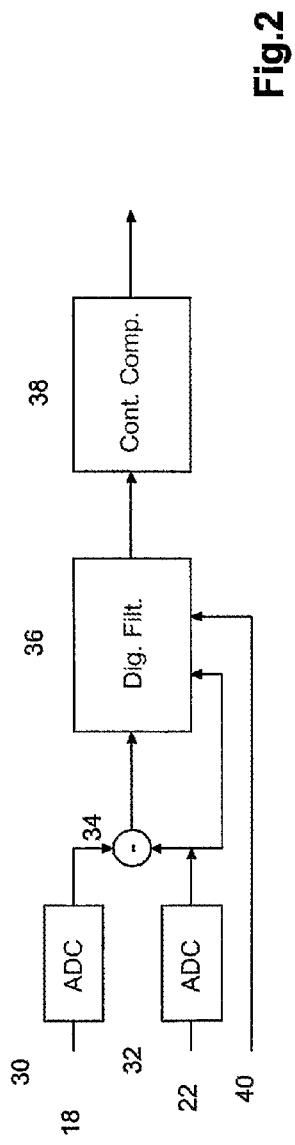
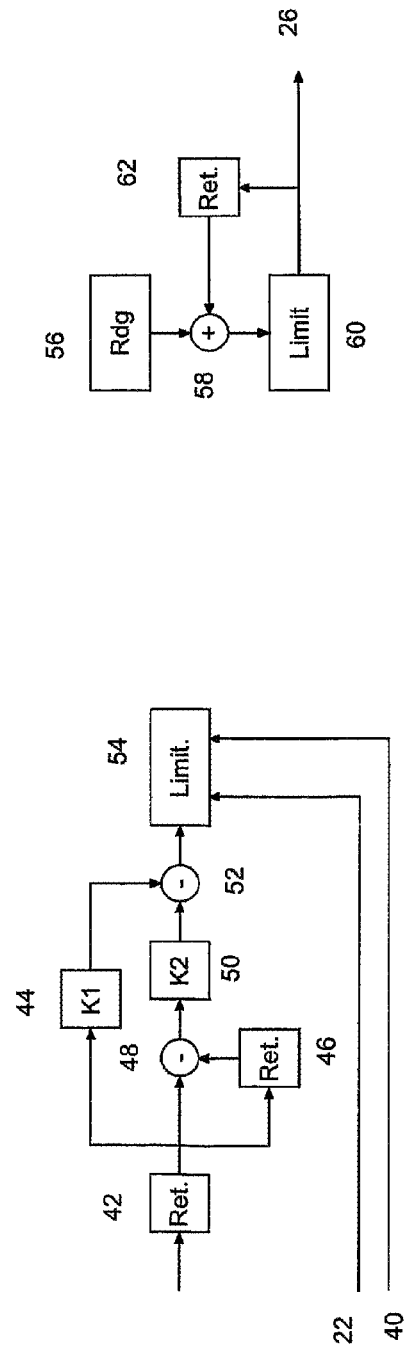
Fig. 2
Fig. 3
Fig. 4

DIGITAL CONTROL DEVICE FOR A PARALLEL PMOS TRANSISTOR BOARD

The invention relates to voltage controls for low consumption circuits.

BACKGROUND OF THE INVENTION

The field of electronics and components related thereto has experienced particular growth.

Initially, integrated circuits were large, and were made up of larger or smaller chips or processors grouped together on printed cards.

Progress in miniaturization has made it possible to move towards chips the size of a microprocessor containing various parts, or "IP."

These integrated circuits are commonly called "System on Chip," or SoC. One particular SoC design, "Network on Chip" (NoC), provides the same advantages, with better IP and communication management within the chip.

These integrated circuits are particularly interesting because they make it possible, in a very reduced size, to contain a set of extremely varied functionalities.

Furthermore, placing all of the elements of the circuit on a single chip reduces the system's consumption.

The power for these extremely miniaturized circuits is the origin of many problems. In fact, given the etching fineness of these chips, there is no longer any question of using standard power systems.

One solution for controlling the voltage of these circuits is the use of boards of digitally controlled parallel PMOS transistors.

In this way, depending on the number of transistors activated, the resistance of the board varies, and with it the voltage supplied to the device downstream.

The command logic for these boards has remained rudimentary to date, primarily with linear slope ramp methods, commonly called thermometers.

This results in slow voltage transitions. These slow transitions also create significant energy dissipations.

The invention aims to improve this situation.

SUMMARY OF THE INVENTION

To that end, the invention proposes a digital control device for a board of parallel PMOS transistors comprising:
- an operative memory for digitally storing error data between a target voltage and a setpoint voltage as well as control data, each datum being provided with a time marker,
- a digital selected order filter for computing setpoint incrementation data from error data in the operative memory selected based on input error data, and for storing said input error data with a corresponding time marker in the operative memory,
- a control computer for computing new control data from the control incrementation data and control data in the operative memory selected based on input error data and for storing the new control data in the operative memory.

This device is particularly interesting because it makes it possible to improve the transition time of the PMOS board, which is interesting both for the powered circuit, and for the energy losses, which are reduced.

BRIEF DESCRIPTION OF THE DRAWINGS

Other features and advantages of the invention will better appear upon reading the following description, taken from examples provided for information and non-limitingly, taken from the drawings, in which:

FIG. 2 shows a modular view of the control device of FIG. 1, FIG. 3 shows an embodiment of an element of the device of FIG. 2, and FIG. 4 shows an embodiment of another element of the device of FIG. 2.

DETAILED DESCRIPTION OF THE PREFERRED EMBODIMENTS

Figure 1:
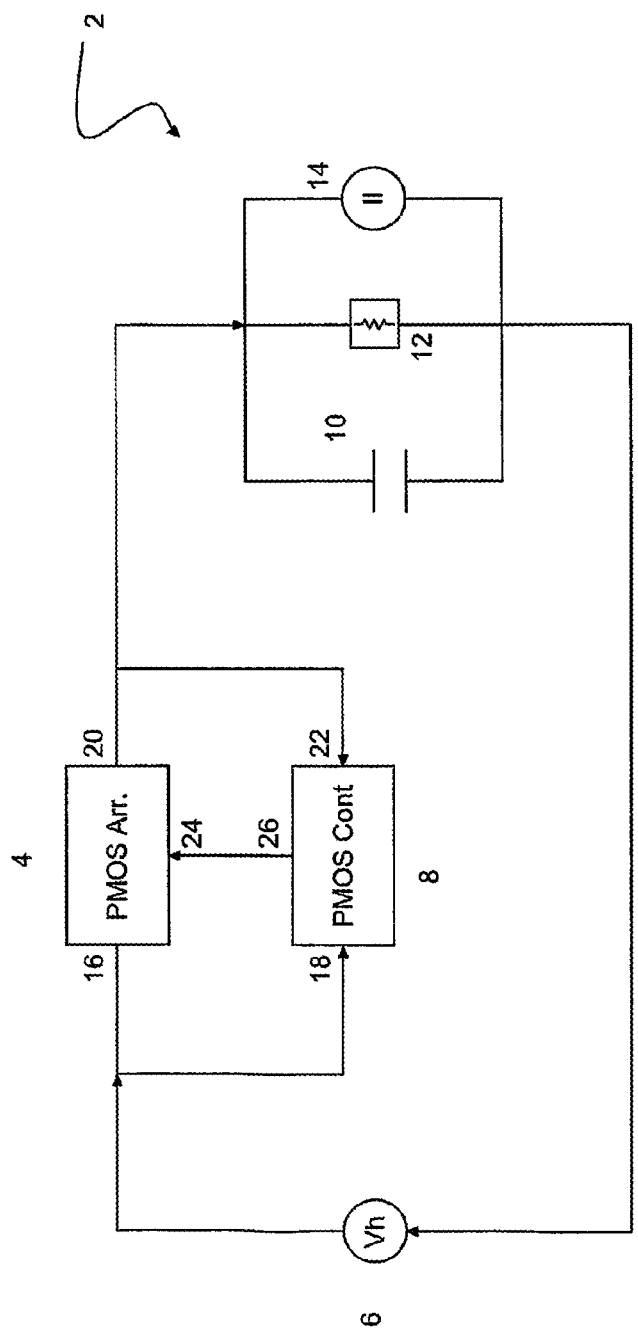
FIG. 1 shows a general diagram of a NoC controlled by a control device according to the invention.

The drawings and the description below contain, for the most part, elements of a certain nature. They may therefore not only be used to make the present invention better understood, but also to contribute to the definition thereof, if necessary.

Additionally, Annex A further contributes to the detailed description, this Annex providing the formulation for certain mathematical formulas used in the context of the invention. The Annex is set aside for clarification purposes, and to facilitate referrals. It is an integral part of the description, and therefore may not only be used to make the present invention better understood, but also to contribute to the definition thereof, if necessary.

FIG. 1 shows a NoC 2 whereof the voltage is controlled by a PMOS board 4 and a voltage source 6. The PMOS board 4 is digitally controlled by a control device 8.

The NoC 2 is shown by its extrinsic electrical characteristics, i.e. it is considered to be a charge with a capacitance 10, a resistance 12, and a current leakage 14 (shown by a leakage current generator).

The ideal voltage source 6 provides a voltage Vh that is supplied at an input 16 of the PMOS board 4 and an input 18 of the control device 8. The PMOS board 4 has an output 20 that is connected to an input 22 of the device 8, and which powers the NoC 2 described above.

The PMOS board 4 comprises a set of n PMOS transistors arranged in parallel. Each transistor has a resistance Ri, and is controlled individually by an input 24 of the PMOS board 4, which receives an outlet 26 of the control device 8.

Thus, the voltages received at the inputs 18 and 22 of the device 8 general a digital control on the output 26 of this device, and this control makes it possible to control each of the transistors of the PMOS board 4 individually, so that the voltage Vh received at the input 16 is controlled by the activated transistors.

As shown below, the device 8 coupled to the board 4 makes it possible to control the voltage of the NoC 2 between a high voltage Vhi and a low voltage Vlo.

In the example described here, the set of PMOS transistors has a same resistance Ri. However, in other embodiments, it would be possible to produce transistors with different resistances.

As is well known, the Joule power dissipated by an element is equal to $RI^2$. And of course the dissipated Joule energy is integral with this power. In the case of a digital circuit, it is the sum of the instantaneous powers multiplied by the time pitch of the circuit according to formula (1) of Annex A.

It therefore clearly appears that it is crucial for the energy efficiency of the circuit to make particularly fast voltage transitions, not generating very many current peaks.

This is allowed by the device 8. In fact, to date, the applications were not demanding to the point that the thermal dissipations of the power of the chips become such a significant challenge.

Additionally, the traditional ramp methods (thermometers) were sufficient for these applications. It is the frequency rise of the circuits, the density increase of the chips, and the inclusion in mobile devices that make managing the power for these circuits crucial.

To date, no satisfactory solution to this problem has been provided. At most, driving voltage optimizations as a function of the processing charge of the voltage-controlled circuit.

The invention makes it possible to offset this owing to the control device 8, which makes it possible to reduce the energy dissipated in several ways.

FIG. 2 shows a modular view of the control device 8 explaining the operating principle thereof.

The control device 8 comprises analog-digital converters 30 and 32, a subtracter 34, a digital filter 36, and a control computer 38.

The converter 30 receives the input 18 from the device 8 to convert the target voltage $V_{ref}$ digitally. The target voltage $V_{ref}$ is received as input from an external loop with a higher management level of the NoC.

The converter 32 receives the input 22 from the device 8 to convert the output voltage $V_c$ of the PMOS board 4 (i.e. the control voltage of the NoC 2) digitally.

The converter outputs 30 and 32 are connected to the subtracter 34, such that the latter sends the difference $e_k$ between these two voltages as output. The difference $e_k$ represents the error, i.e. the voltage jump that is necessary to bring the control voltage to its target value.

The index k indicates that the value is taken for the $k^{th}$ sample (or time pitch).

The digital filter 36 receives, as input, the difference $e_k$, the voltage $V_c$ in digital form (hereafter denoted $V_{ck}$), and intensity information $\Delta I_M$ from an input 40 of the device 8 that will be described with FIG. 3.

$\Delta I_M$ is a user-specific constant, and describes a maximum limit on the intensity jumps each time the PMOS board is updated.

The digital filter 36 calculates an incremental jump that corresponds to the number of transistors that must be activated or deactivated to offset the digital voltage error $e_k$. This increment jump of the control is then transmitted to the control computer 38, which converts it into a digital command to control the PMOS board 4.

FIG. 3 shows a particular embodiment of the digital filter 36.

The digital filter comprises a retarder 42, a multiplier 44, a retarder 46, a subtracter 48, a multiplier 50, a subtracter 52, and a limiter 54.

The retarder 42 receives the input of the digital filter 36. The retarder 42 serves to put out the error of the time pitch preceding the received input. In the present case, the retarder 42 therefore returns the error $e_{k-1}$.

The error $e_{k-2}$ is then transmitted to the subtracter 48, which returns, in output, the difference between the errors $e_{k-1}$ and $e_{k-2}$. This difference is sent to the multiplier 50.

The multiplier 44 and the multiplier 50 return their input multiplied by a fixed coefficient.

The outputs of the multipliers 44 and 50 are connected to the subtracter 52, so that the latter returns, in output, the difference between the multiple of the error $e_{k-1}$ and the multiple of the difference between the errors $e_{k-1}$ and $e_{k-2}$.

The value of this jump (which represents a number of transistors) will be called $\Delta u_k$ in the following.

The filtering part strictly speaking is therefore produced by the retarder 42, the multiplier 44, the retarder 46, the subtracter 48, the multiplier 50, and the subtracter 52.

At the output of the subtracter, there is therefore a second order digital filter according to formula (2) of Annex A.

The values of the coefficients of the multipliers 44 and 50 are respectively chosen as a function of the data from the NoC 2 and the data from the PMOS board 4, according to formulas (3) and (5) of Annex A.

In these formulas, the parameters are defined as follows:

$\omega_n$ is the clock frequency, $u_{k1}$ is the number of transistors of the PMOS transistor board that are activated at the low voltage level, C is the capacitance of the NoC, $R_0$ is the characteristic resistance of the resistances from the PMOS transistor board, $R_1$ is the dynamic resistance of the NoC at the low voltage level, b is the opposite of the time constant $R_0C$, $\beta_1$ is the opposite of the time constant $R_1C$, $\xi$ is a damping constant chosen in the range $[A+\frac{1}{4}, A+\frac{1}{2}]$ with A defined using formula (4) from Annex A.

Owing to the digital filter thus made, the convergence towards the target voltage $V_{ref}$ is much faster, which limits energy losses.

Then, the value $\Delta u_k$ is sent into the limiter 54.

The limiter 54 further improves the performance of the digital filter 36.

When the error $e_k$ is significant, the resulting jump at the output of the subtracter 52 can have a high value.

This results in a jump with a significant intensity in the PMOS board 4, which is unfavorable in terms of energy losses.

The limiter 54 makes it possible to control these losses by limiting the value that $\Delta u_k$ can assume in order to limit the corresponding intensity jump.

Since the time pitches are very short, it is better to use an additional cycle to reach the target voltage than to dissipate too much energy because of the digital filter.

As mentioned above, the limiter 54 receives $V_k$ and $\Delta I_M$ in input. $\Delta I_M$ represents the maximum intensity jump accepted for the digital filter 36 in order to limit the energy losses.

In the example described here, the value of $\Delta I_M$ is set and equal to $(Vhi-Vlo)/2R_0$. This makes it possible to obtain a fairly direct current with decreased energy losses.

This amounts to a limitation of the values of $\Delta u_k$ according to formula (6) in Annex A, where $C_{\Delta I}$ is a current variation margin coefficient.

Thus, at the outlet of the digital filter 36, an incrementation value of the limited transistor $\Delta u_{k(b)}$ is obtained.

The control computer 38 will take this implementation value and transform it into a command strictly speaking FIG. 4 shows an embodiment of the control computer 38.

The control computer 38 comprises a rounder 56, an adder 58, a retarder 62 and a limiter 60.

The rounder 56 receives the output of the digital filter 36. Indeed, the limited incrementation value coming out is not necessarily whole, but a whole number of transistors will be activated or deactivated.

The rounder 56 operates as a traditional whole value function, by rounding to the next highest whole number if the decimal part is greater than or equal to 0.5 and by rounding to the next lowest whole number if not.

An output $\Delta u_{k(b,a)}$ is obtained, i.e. limited and rounded.

The output of the rounder 56 is connected to the adder 58, which also receives the output of the retarder 62. The retarder 62 sends the adder 58 the command of the preceding time pitch.

Thus, at the output of the adder 58, a control value $u_k = u_{k-1} + \Delta u_{k(b,a)}$ is obtained.

However, it is possible for the value obtained for $u_k$ to exceed the number of transistors of the PMOS board 4.

The value $u_k$ is therefore sent into the limiter 60 at the output of the adder 58. As for the limiter 54, the limiter 60 limits the absolute value of $u_k$ so that it does not exceed the total number of transistors in the PMOS transistor board.

Lastly, in output, the control $u_k$ is sent on the output 26 towards the input 24 of the PMOS board 2.

In the preceding, certain data is stored in operative memory, or taken therefrom. Examples include the data from the retarders, or the limit data from the limiters (such as $I_M$, for example). This memory can be used in several ways.

According to a first alternative, each element that uses stored data or data to be stored can have its own memory space.

According to a second alternative, a set of memories can be shared between several elements. In this case, it is possible to provide a memory for each group of elements.

For example, it is then possible to have a memory for the retarders 42 and 46, a memory for the data of the limiter 54, a memory for the retarder 62, and a memory for the data of the rounder 56 and the limiter 60.

Lastly, according to the third alternative, a single memory may be shared by all of the elements of the device 8.

The invention is not limited to the embodiment described above. It in particular covers all of the embodiments covered by the following set of claims, and in particular with the following characteristics:
- the digital filter can be of an order higher than 2, and with different constants;
- the limiters can limit the various signals differently depending on whether they are positive or negative, and not only limit the absolute value of these signals;
- the rounder can be omitted in certain cases;
- it would be possible to call the rounder with the output control of the limiter.

ANNEX A $$E_J = \Sigma_t R I^2 \times \Delta t \quad (1)$$

$$\Delta u_k = K_1(e_{k-1} - e_{k-2}) + K_2 e_{k-1} \quad (2)$$

$$K_1 = \frac{\varpi_n(4\xi - 1) - 2(u_{kl} + \beta_l)}{2b(V_{hi} - v_{lo})} \quad (3)$$

$$A = \frac{u_{kl} b + \beta_l}{2\varpi_n} \quad (4)$$

$$K_2 = \frac{\varpi_n}{b(v_{hi} - v_{lo})} \quad (5)$$

$$|\Delta u_k| < \frac{C_{\Delta I} R_o}{V_{hi} - V_c} \Delta I_M \quad (6)$$

The invention claimed is:

1. A digital control device for controlling a board of parallel PMOS transistors comprising:
   - an operative memory for digitally storing error data between a target voltage and a setpoint voltage corresponding to a voltage outputted by the board of parallel PMOS transistors as well as control data, each datum being provided with a time marker,
   - a digital selected order filter for computing control incrementation data from error data in the operative memory selected as a function of input error data, and for storing said input error data with a corresponding time marker in the operative memory,
   - a control computer for computing new control data from the control incrementation data and from control data in the operative memory selected as a function of input error data and for storing the new control data in the operative memory,
   - wherein the control incrementation data correspond to a number of transistors to be activated or deactivated in the board of parallel PMOS transistors to offset an error indicated by the input error data,
   - wherein the digital filter also comprises a limiter for limiting the control incrementation data as a function of intensity limit data representing a maximum intensity jump in the board of parallel PMOS transistors and as a function of the setpoint voltage corresponding to the voltage outputted by the board of parallel PMOS transistors,
   - wherein the limiter is adapted for limiting the absolute value of control incrementation data as a function of $$\frac{C_{\Delta I} R_0}{V_{hi} - V_c} \Delta I_M,$$

wherein $\Delta I_M$ are the intensity limit data, $V_c$ is the setpoint voltage corresponding to the voltage outputted by the board of parallel $C_{\Delta I}$ is a current variation margin coefficient, $R_0$ is a characteristic resistance of the resistances of the board of parallel PMOS transistors, $V_{hi}$ is a maximum value of a range of reachable values for the setpoint voltage.

2. The device according to claim 1, wherein the control computer comprises a limiter for limiting the control data as a function of control limit data.

3. The device according to claim 1, wherein the digital filter is of an order greater than or equal to two, the parameters of which are set as a function of a charge downstream of the board of PMOS transistors.

4. The device according to claim 1, wherein the control computer comprises a limiter for limiting the control data as a function of control limit data.

5. The device according to claim 1, wherein the digital filter is of an order greater than or equal to two, the parameters of which are set as a function of a charge downstream of the board of PMOS transistors.

6. The device according to claim 1, wherein the control data indicates a number of transistors to be activated.

7. The device according to claim 2,
   - wherein the control data indicates a number of transistors to be activated, and
   - wherein the limiter is configured to limit the control data so that the number of transistors indicated by the control data does not exceed a total number of transistors of the board of parallel PMOS transistors.

8. The device according to claim 1, wherein, $\Delta I_M$ is a function of $(V_{hi} - V_{10})/2R_0$, and $V_{10}$ is a minimum value of the range of reachable values for the setpoint voltage.

* * * * *